United States Patent
O'Brien et al.

(10) Patent No.: US 12,293,255 B2
(45) Date of Patent: May 6, 2025

(54) LOW LOSS BROADBAND QUANTUM LIMITED FLOQUET-MODE AMPLIFIER

(71) Applicant: Massachusetts Institute of Technology, Cambridge, MA (US)

(72) Inventors: Kevin O'Brien, Somerville, MA (US); Kaidong Peng, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 290 days.

(21) Appl. No.: 17/987,962

(22) Filed: Nov. 16, 2022

(65) Prior Publication Data

US 2024/0160975 A1    May 16, 2024

(51) Int. Cl.
*G06N 10/20*    (2022.01)
*G06N 10/60*    (2022.01)
(Continued)

(52) U.S. Cl.
CPC ............. *G06N 10/20* (2022.01); *G06N 10/60* (2022.01); *H01P 3/006* (2013.01); *H01P 11/006* (2013.01); *H03F 19/00* (2013.01); *H10N 60/12* (2023.02)

(58) Field of Classification Search
CPC ........ G06N 10/20; G06N 10/60; H01P 3/006; H01P 11/006; H10N 60/12; H10N 69/00; H03F 19/00
(Continued)

(56) References Cited

U.S. PATENT DOCUMENTS 3,913,027 A    10/1975  Zappe
4,638,257 A *   1/1987  McDonald ............. H03F 19/00
                                                 505/855
(Continued)

FOREIGN PATENT DOCUMENTS

FI             129520 B     3/2022
WO       2020/152393 A1    7/2020
(Continued)

OTHER PUBLICATIONS

Floquet-Mode Traveling-Wave Parametric Amplifiers Kaidong Peng, 1,2 Mahdi Naghiloo,2 Jennifer Wang , 1,2 Gregory D. Cunningham,2,3 Yufeng Ye, 1,2 : PRX Quantum 3, 020306 (2022) (Year: 2022).*
(Continued)

*Primary Examiner* — Arnold M Kinkead
(74) *Attorney, Agent, or Firm* — Nields, Lemack & Frame, LLC

(57) ABSTRACT

A Floquet mode traveling wave parametric amplifier (TWPA) is disclosed. The Floquet mode TWPA comprises a plurality of stages, where each stage is made up of a nonlinear element and a shunt capacitor. The nonlinear elements may be Josephson junctions, or a combination of series and/or parallel Josephson junctions. The Floquet mode TWPA is designed such that the critical current of the nonlinear elements in each stage is not constant. In some embodiments, the ratio of the largest critical current to the smallest critical current in the Floquet mode TWPA is at least 2:1. In some embodiments, the nonlinear elements with the largest critical current are disposed at or near the input or output of the amplifier. In this way, reflections and backward amplification may be minimized. Further, the TWPA is formed using planar capacitors on a high resistivity substrate, or using low loss parallel plate capacitors.

24 Claims, 7 Drawing Sheets

(51) Int. Cl.
- *H01P 3/00* (2006.01)
- *H01P 11/00* (2006.01)
- *H03F 19/00* (2006.01)
- *H10N 60/12* (2023.01)

(58) Field of Classification Search
USPC ............. 333/99 S; 326/1; 307/306; 330/61 R
See application file for complete search history.

(56) References Cited

U.S. PATENT DOCUMENTS

| | | | |
|---|---|---|---|
| 7,701,286 | B2 | 4/2010 | Gupta et al. |
| 8,878,626 | B2 | 11/2014 | Zmuidzinas et al. |
| 10,491,178 | B2 | 11/2019 | Naaman et al. |
| 10,995,891 | B2 | 5/2021 | Kozicz et al. |
| 10,998,869 | B2 | 5/2021 | Miano et al. |
| 11,277,107 | B2 | 3/2022 | Bell et al. |
| 2018/0034425 | A1 | 2/2018 | Bell et al. |
| 2020/0287540 | A1* | 9/2020 | Smith .................... H10N 69/00 |
| 2020/0350880 | A1 | 11/2020 | Miano et al. |
| 2021/0265964 | A1 | 8/2021 | Miano et al. |
| 2022/0021362 | A1 | 1/2022 | Roch et al. |
| 2022/0029083 | A1 | 1/2022 | Wymore et al. |
| 2022/0052662 | A1 | 2/2022 | White et al. |
| 2022/0094320 | A1 | 3/2022 | Vesterinen et al. |
| 2022/0115577 | A1 | 4/2022 | Beck et al. |
| 2022/0311400 | A1 | 9/2022 | White et al. |
| 2022/0321073 | A1 | 10/2022 | Pla et al. |
| 2022/0337207 | A1 | 10/2022 | Naaman et al. |

FOREIGN PATENT DOCUMENTS

| | | |
|---|---|---|
| WO | 2021/046603 A1 | 3/2021 |
| WO | 2021/214383 A1 | 10/2021 |
| WO | 2022/120171 A1 | 6/2022 |

OTHER PUBLICATIONS

International Search Report and Written Opinion mailed Apr. 5, 2024 in corresponding PCT application No. PCT/US2023/035080.
Bell et al., Traveling-Wave Parametric Amplifier Based on a Chain of Coupled Asymmetric SQUIDs. Physical Review Applied, 4, 024104, 9 pages, 2015.
Eom et al., A wideband, Low-noise Superconducting Amplifier with High Dynamic Range. Nature Physics. vol. 8, 5 pages, Aug. 2012.
Feng et al., Design and Measurement of a Josephson Traveling Wave Parametric Amplifier Fabricated in a Superconducting Qubit Process. 2020 IEEE/MTT-S International Microwave Symposium. pp. 940-943.
Macklin et al., A Near-quantum-limited Josephson Traveling-wave Parametric Amplifier. Science. vol. 350, Iss. 6258, pp. 307-310, Oct. 16, 2015.
Malnou et al., Three-Wave Mixing Kinetic Inductance Traveling-Wave Amplifier with Near-Quantum-Limited Noise Performance. PRX Quantum 2, 010302, 2021.
Miano et al., Symmetric Traveling Wave Parametric Amplifier. IEEE Transactions on Applied Superconductivity vol. 29, No. 5, 6 pages, Aug. 2019.
O'Brien et al., Resonant Phase Matching of Josephson Junction Traveling Wave Parametric Amplifiers. Physical Review Letters. 157001, 5 pages, Oct. 2014.
Peng et al., Floquet-Mode Traveling-Wave Parametric Amplifiers. PRX Quantum 3, 020306, 20 pages, 2022.
Planat et al., Photonic-Crystal Josephson Traveling-Wave Parametric Amplifier. Physical Review X 10, 021021, 19 pages, 2020.
Qiu et al., Broadband Squeezed Microwaves and Amplification with a Josephson Traveling-Wave Parametric Amplifier. Nature Physics, 32 pages, 2023.
Ranadive et al., Kerr reversal in Josephson meta-material and traveling wave parametric amplification. Nature Communications. vol. 13, 9 pages, 2022.
Roy et al., Broadband parametric amplification with impedance engineering: Beyond the gain-bandwidth product. Applied Physics Letters, 107, 262601, 6 pages, 2015.
Sivak et al., Josephson Array-Mode Parametric Amplifier. Physical Review Applied, 13, 024104, 14 pages, 2020.
White et al., Traveling wave parametric amplifier with Josephson junctions using minimal resonator phase matching. Applied Physics Letters, 106, 242601, 6 pages, 2015.
Winkel et al., Nondegenerate Parametric Amplifiers Based on Dispersion-Engineered Josephson-Junction Arrays. Physical Review Applied, 13, 024015, 19 pages, 2020.

* cited by examiner

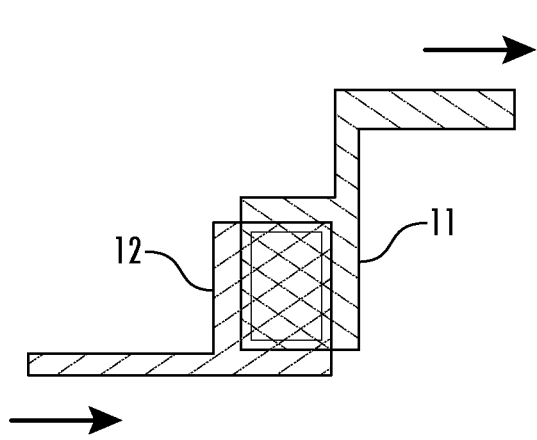
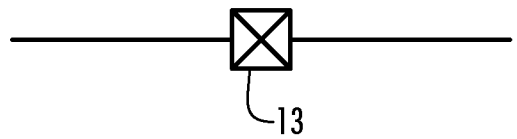
FIG. 2A
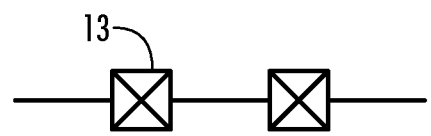
FIG. 2B
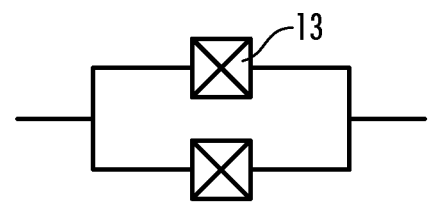
FIG. 2C
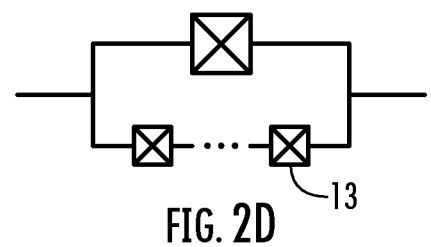
FIG. 2D

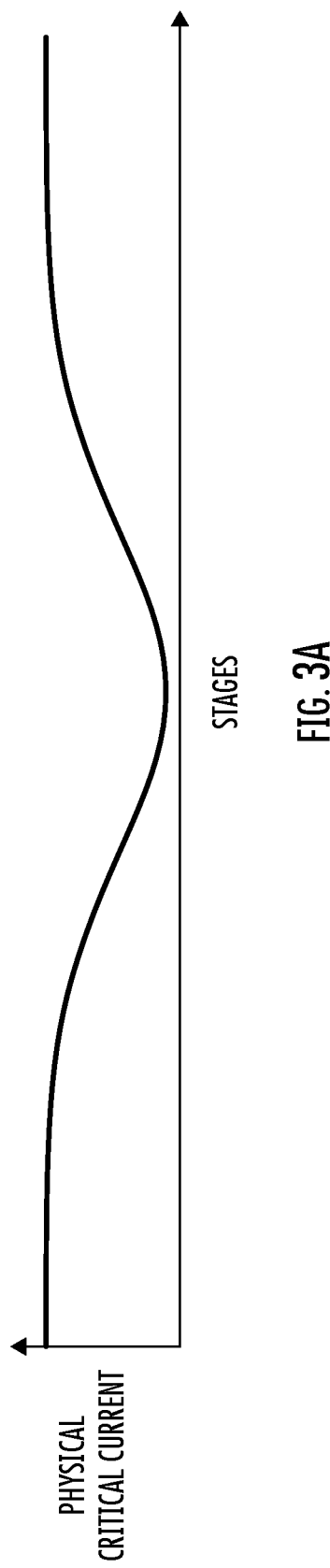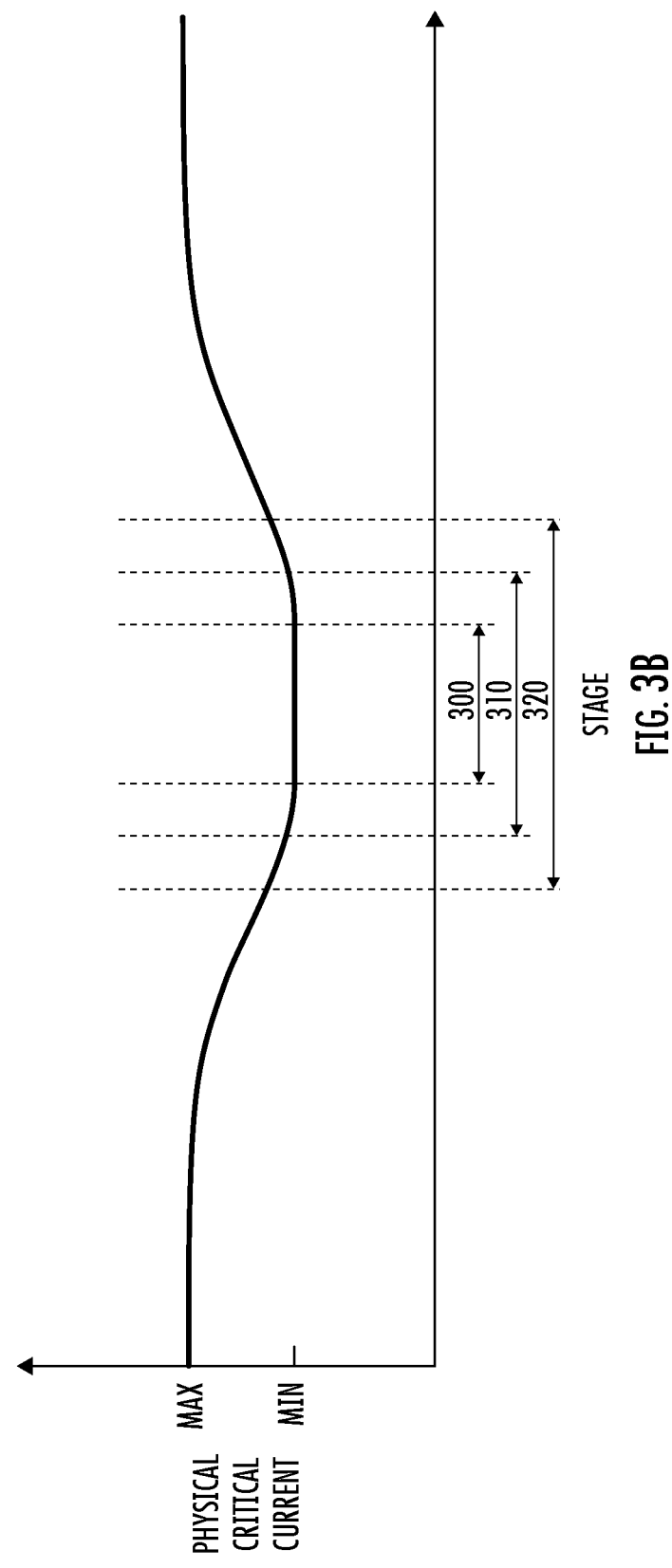

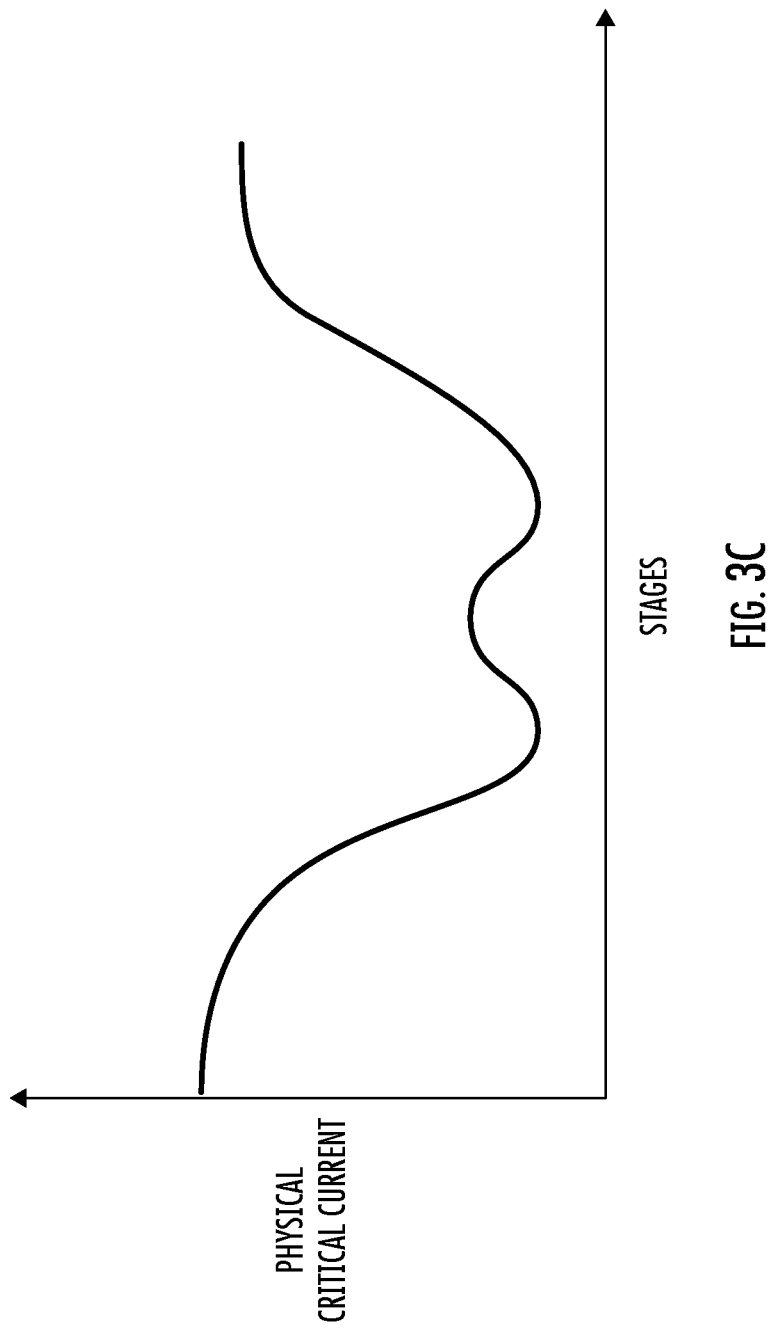

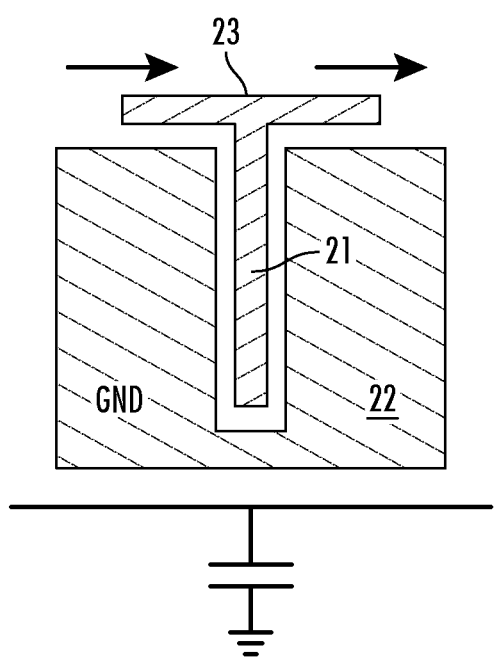
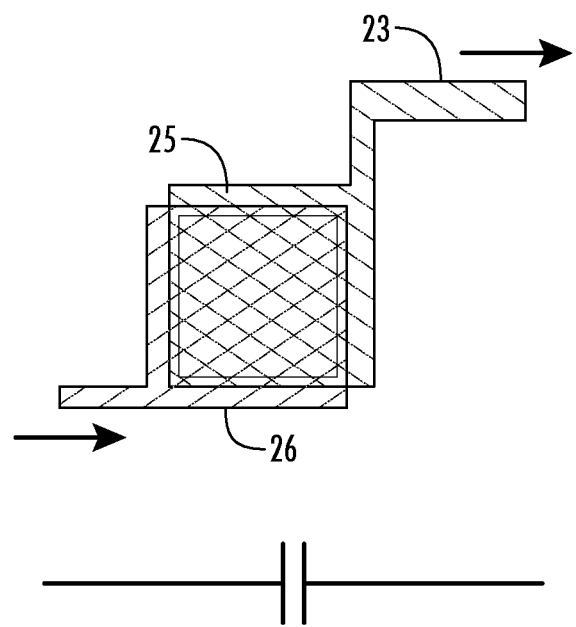
FIG. 4A
FIG. 4B

LOW LOSS BROADBAND QUANTUM LIMITED FLOQUET-MODE AMPLIFIER

Embodiments of the present disclosure relate to a broadband amplifier with quantum-limited noise performance, and more particularly a Floquet mode traveling-wave parametric amplifier with Josephson junctions and low-loss capacitors in a high-quality superconducting circuit fabrication process.

BACKGROUND

The ability to perform fast, high-fidelity, and scalable qubit readout is of fundamental importance to the construction and operation of large-scale quantum information processors. Signals carrying information regarding quantum states or the computational results of interest are intrinsically low power. These signals therefore require low noise amplification by typically more than five orders of magnitude before they can be measured and distinguished from environmental noises by classical electronics.

The preamplifiers or first amplifiers commonly used in superconducting quantum experiments and metrology are semiconductor high electron mobility transistors (HEMTs) or superconducting parametric amplifiers. While commercially available, HEMTs only have a quantum efficiency on the order of 10% and are therefore typically used as preamplifiers only when superconducting parametric amplifiers are unavailable.

Two variants of superconducting parametric amplifiers, Josephson parametric amplifiers (JPAs) and conventional Josephson traveling wave parametric amplifiers (JTWPAs), are routinely used as first amplifiers to measure superconducting qubits. Josephson parametric amplifiers are based on nonlinear resonators and have near-ideal quantum efficiency (~100%), but their limited bandwidth and dynamic range as compared to wideband parametric amplifiers only permit on the order of one qubit to be measured on a measurement line at the same time.

Floquet mode traveling wave parametric amplifiers (Floquet mode TWPAs) theoretically promise to provide broadband amplification with near-ideal quantum efficiency. These amplifiers may eventually enable fast, high-fidelity readout of tens to hundreds of qubits in each single unit simultaneously for scalable large-scale quantum computers. However, Floquet mode TWPAs have not been realized in practice as they require greater electrical length by design and are consequently more vulnerable to material loss, leading to limited quantum efficiency using current fabrication techniques.

Therefore, it would be beneficial if there was a Floquet mode traveling wave parametric amplifier with near-ideal quantum efficiency (~100%). It would also be advantageous if this traveling wave parametric amplifier had large bandwidth and power handling sufficient for the readout of multiple qubits.

SUMMARY

A Floquet mode traveling wave parametric amplifier (TWPA) is disclosed. The Floquet mode TWPA comprises a plurality of stages, where each stage is made up of a nonlinear element and a capacitor. The nonlinear elements may be Josephson junctions, or a combination of series and/or parallel Josephson junctions. The Floquet mode TWPA is designed such that the critical current of the nonlinear elements in each stage is not constant. In some embodiments, the ratio of the largest critical current to the smallest critical current in the Floquet mode TWPA is at least 2:1. In some embodiments, the nonlinear elements with the largest critical current are disposed at or near the input or output of the amplifier. In this way, reflections and backward amplification may be minimized. Further, the TWPA is formed using planar capacitors on a high resistivity substrate, or using low loss parallel plate capacitors.

According to one embodiment, a Floquet mode traveling wave parametric amplifier (TWPA), having an input and an output, is disclosed. The Floquet mode TWPA comprises a circuit having a plurality of stages, wherein each stage comprises a nonlinear element and a capacitor, wherein a critical current of the nonlinear element decreases monotonically from the input to a trough and increases from the trough to the output, wherein the trough is defined as a continuous series of stages wherein each stage in the trough has a critical current within 5% of a minimum critical current, and wherein at least 10% of the stages are in the trough. In some embodiments, an expanded trough is defined as a continuous series of stages wherein each stage in the expanded trough has a critical current within 10% of the minimum critical current, wherein at least 30% of the stages are in the expanded trough. In certain embodiments, at least 40% of the stages are in the expanded trough. In some embodiments, a ratio of a maximum critical current to the minimum critical current is at least 2. In some embodiments, the nonlinear element comprises a Josephson junction or a plurality of Josephson junctions arranged in series, in parallel or a combination of serial and parallel. In some embodiments, the circuit is disposed on a substrate having a resistivity greater than 1000 Ωcm and the capacitor comprises a planar capacitor. In some embodiments, the capacitor comprises a parallel plate capacitor wherein a dielectric between parallel plates is formed using controlled in-situ oxidation. In some embodiments, each capacitor is configured such that an impedance of a stage is within 20% of an adjacent stage. In some embodiments, a graph of critical current as a function of stage number, excluding the trough, is an inverse Gaussian curve. In some embodiments, the nonlinear elements are chained together and the capacitors comprise shunt capacitors.

According to another embodiment, a Floquet mode traveling wave parametric amplifier (TWPA), having an input and an output, is disclosed. The Floquet mode TWPA comprises a circuit having a plurality of stages, wherein each stage comprises a nonlinear element and a capacitor, wherein a ratio of a largest critical current of one of the nonlinear elements to a smallest critical current of another of the nonlinear elements is between 2 and 5. In some embodiments, the nonlinear element comprises a Josephson junction or a plurality of Josephson junctions arranged in series, in parallel or a combination of serial and parallel. In some embodiments, the one of the nonlinear elements with the largest critical current is the nonlinear element disposed in the stage adjacent to the input or the output. In some embodiments, the circuit is disposed on a substrate having a resistivity greater than 1000 Ωcm and the capacitor comprises a planar capacitor. In some embodiments, the capacitor comprises a parallel plate capacitor wherein a dielectric between parallel plates is formed using controlled in-situ oxidation. In some embodiments, the nonlinear elements are chained together and the capacitors comprise shunt capacitors.

According to another embodiment, a Floquet mode traveling wave parametric amplifier (TWPA), having an input and an output, is disclosed. The Floquet mode TWPA comprises a circuit having a plurality of stages, including an input stage at the input, an output stage at the output; wherein each stage comprises a nonlinear element and a capacitor and each nonlinear element has a critical current; wherein a segment is defined as a chain of stages having an electrical length equal to one wavelength of interest, wherein the segment comprising the stage adjacent to the input is defined as an input segment; wherein the segment comprising a stage having a smallest critical current is defined as a high gain segment; and wherein a ratio of an average of critical currents in the input segment to the average of critical currents in the high gain segment is between 2 and 4. In certain embodiments, the segment comprising the stage adjacent to the output is defined as an output segment; and the ratio of the average of critical currents in the output segment to the average of critical current in the high gain segment is between 2 and 4. In some embodiments, the wavelength of interest is between 30 μm and 3 meters. In some embodiments, each segment comprises at least five stages. In some embodiments, the circuit has an electrical length of at least five wavelengths. In some embodiments, the nonlinear elements are chained together and the capacitors comprise shunt capacitors.

BRIEF DESCRIPTION OF THE FIGURES

For a better understanding of the present disclosure, reference is made to the accompanying drawings, which are incorporated herein by reference and in which:

FIG. 2A shows the layout of a "Manhattan-style" Josephson junction;

FIGS. 2B-2D show various configurations of the nonlinear element using Josephson junctions;

FIG. 3A shows a graph of the physical critical current of the nonlinear element vs. stage according to one embodiment;

FIG. 3B shows a graph of the physical critical current vs. stage according to another embodiment;

FIG. 3C shows a graph of physical critical current vs. stage according to a third embodiment;

FIG. 4A shows a distributed coplanar waveguide stub capacitor;

FIG. 4B shows a with a parallel plate capacitor;

DETAILED DESCRIPTION

The present disclosure makes use of low-loss superconducting circuit elements to physically implement the Floquet mode TWPA that has small material loss and approaches the ideal theoretical noise performance. Both of these features are critical to the qubit readout speed and fidelity.

Traveling wave parametric amplifiers are very different from traditional Josephson parametric amplifiers (JPAs) or other resonant parametric amplifiers. Josephson parametric amplifiers are nonlinear resonators such that their input and output ports are intentionally impedance mismatched to the input and output linear transmission lines. JPAs typically are made up of only one or few nonlinear elements and utilize the resonant interactions of its resonator structure to amplifier signals efficiently but have small amplifying bandwidth and power handling capability (dynamic range).

In contrast, Floquet mode TWPAs are nonlinear transmission lines, which ideally are well impedance matched to the input and output linear transmission lines and amplify signals through the elongated wave propagation length. These devices have larger instantaneous bandwidth, which implies that a single circuit may accommodate a much wider range of frequencies than may be achieved with a JPA. The design of a TWPA requires careful control of the dispersion (wave propagation properties such as wave velocity) and suppression of copropagating sidebands which are not relevant in the context of Josephson parametric amplifiers.

Figure 1A:
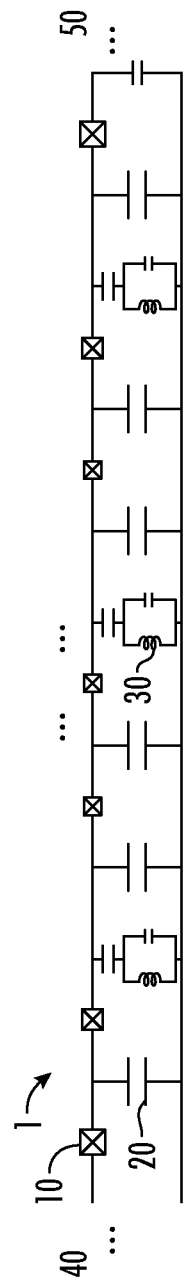
FIG. 1A shows a schematic diagram of the Floquet mode traveling wave parametric amplifier according to one embodiment.
Figure 6:
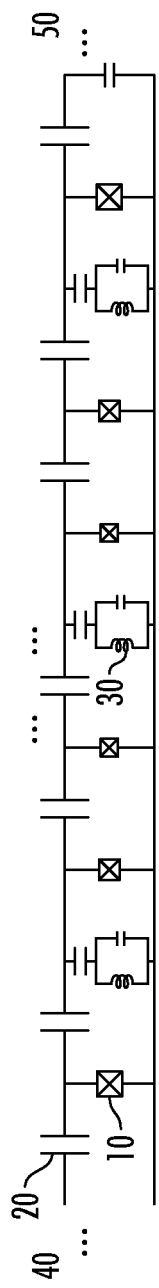
FIG. 6 shows a schematic diagram of the Floquet mode traveling wave parametric amplifier according to another embodiment.

As shown in FIG. 1A, the Floquet mode traveling wave parametric amplifier is constructed using superconducting circuits arranged as a chain of superconducting nonlinear elements and low-loss capacitors in the arrangement of nonlinear transmission lines. In this embodiment, the superconducting nonlinear elements are connected in series and the capacitors are shunt to electrical ground and is sometimes referred to as right-handed transmission lines. In another embodiment, shown in FIG. 6, the capacitors are connected in series and the superconducting nonlinear elements are shunted to ground and is sometimes referred to as left-handed transmission lines. While the disclosure mainly describes the right-handed transmission line shown in FIG. LA, the description and theory may also apply to the embodiment shown in FIG. 6.

Specifically, FIG. 1A shows a circuit 1 with a plurality of nonlinear elements 10, such as Josephson junctions, which are arranged in series. As is well known to those skilled in the art, a Josephson junction is a structure that comprises two superconducting links that are coupled by a weak link. In some embodiments, this weak link is an insulating barrier between the links.

The current passing through a Josephson junction is defined as $I_J = I_0 \sin(\delta)$ where $I_0$ is the critical current parameter of the junction and $\delta$ is the difference in phase across the junction. Further, the voltage across a Josephson junction is defined as $$V = \frac{\Phi_0 d\delta}{2\pi dt},$$

wherein $\Phi_0 = h/2e$ is the superconducting flux quantum. Differentiating the current equation and substituting for $$\frac{d\delta}{dt}$$

yields $$\frac{dI_J}{dt} = I_0 \cos(\delta) \frac{2\pi}{\Phi_0} V$$

which is the standard form of an inductor. Thus, the Josephson junction behaves as a nonlinear inductor having an inductance of $$L_J = \frac{\Phi_0}{2\pi I_0 \cos(\delta)}.$$

FIG. 2A shows a single Josephson junction that is implemented with a "Manhattan-style" layout. This "Manhattan-style" layout is just one method of constructing Josephson junctions. There are also "Dolan style" and "Lecocq style" implementations. All Josephson junctions are configured as a superconductor—a weak link (thin dielectric/insulator)—a superconductor. In the "Manhattan-style" implementation, the first metal link 11 is first deposited on the substrate from a first angle and the second metal link 12 may be deposited from a second angle, which may be 90° apart from the first angle on the horizontal plane. The two metal links 11,12 are deposited from two different angles to ensure that the two metals do not make contact or short with each other on either side. In the "Dolan-style" implementation, the two overlapping metal links are deposited at an oblique angle from the opposite sides of a single suspended bridge or free-standing shadow mask that may be made of photoresist, and the dielectric link is formed by an in-situ oxidation of the top surface of the first deposited bottom metal layer.

Usually and in both these two cases, the thin dielectric between the metal links is formed not by deposition, but by in-situ oxidation of the top surface of the bottom metal electrode before depositing the top metal layer from a different angle to ensure high film quality and low material defects.

In some embodiments, a single Josephson junction 13 is used as the nonlinear element 10 in the circuit 1. However, Josephson junctions 13 may be arranged in a plurality of different configurations to form the nonlinear element 10. FIG. 2B-2D shows several configurations. FIG. 2B shows two Josephson junctions 13 connected in series. However, it is understood that any number of Josephson junctions 13 may be connected in series. This configuration may allow better power handling. FIG. 2C shows two Josephson junctions 13 connected in parallel. This configuration is also referred to as SQUID (superconducting quantum interference device). In some embodiments, SQUIDs may also be biased using an external magnetic field threading the loop. This configuration may allow in situ impedance matching through modification of the magnetic field. Thus, FIG. 2C includes configurations that have a magnetic flux as well as those configurations without a magnetic flux bias. FIG. 2D shows a configuration in which Josephson junctions 13 are in series and in parallel. This configuration may also include a flux bias in certain embodiments. One particular configuration comprises one Josephson junction in parallel with three Josephson junctions, wherein the size of the Josephson junctions on each arm has a certain ratio. This configuration may include a flux bias and is sometimes also referred to as SNAILS (superconducting nonlinear asymmetric indicative element). Another particular embodiment comprises one Josephson junction in parallel with two Josephson junctions, which may have a flux or may be unbiased. This configuration may be referred to as flux qubits. Other configurations may be referred to as quartons. Any of these configurations or variations thereof may be used as the nonlinear element 10 for the circuit 1.

Disposed between each pair of adjacent nonlinear elements 10 is a shunt capacitor 20.

The combination of the nonlinear element 10 and the shunt capacitor 20 comprise a single stage of the circuit 1. In some embodiments, there may be between several hundred and several thousand stages in the Floquet mode TWPA. The number of stages may also be expressed as a function of the wavelength of interest. In this disclosure, the wavelength of interest is defined as the wavelength that is being amplified. In certain embodiments, the electrical length of circuit 1 is at least 5 wavelengths of interest. Electrical length is defined as the sum of the phases across each nonlinear element 10. In certain embodiments, there are at least five stages per wavelength in electrical length. Stated differently, $2\pi$ divided by the phase across each nonlinear element, is greater than 5, at the wavelength of interest. In other embodiments, the electrical length of the circuit 1 may be much longer than 5 wavelengths and/or the number of stages per wavelength may be greater than 5. For example, the electrical length of the circuit 1 may be 100 wavelengths or more. In some embodiments, the circuit 1 may be larger than 150, 200 or 300 wavelengths. The frequencies of interest may be in the range from 100 MHz to 100 GHz, which results in wavelengths from 30 μm to 3 meters accounting for the specific wave velocity of the transmission line structure. In some specific embodiments, the wavelengths of interest may be from 1 GHz to 20 GHz, which is the range of frequencies typically used for superconducting quantum computing and circuits.

The circuit 1 includes a first stage, or input stage that is at the input 40 of the circuit 1. The circuit 1 includes a last stage, or output stage that is at the output 50 of the circuit 1. The circuit 1 also includes a center stage. If there are an odd number (N+1) of stages, the center stage is defined as the stage having an equal number of stages (N/2) before it and after it. If there are an even number (N) of stages, the center stage is defined as the stage wherein half of the stages (N/2) are disposed on one side and one less than half of the stages (N/2–1) are disposed on the opposite side.

The inductance of the nonlinear element 10 and the capacitance of the shunt capacitor 20 determine the impedance of each stage of the Floquet mode TWPA.

Additionally, phase adjustment circuitry 30, which may be in the form of shunt inductors and capacitors, may be disposed between adjacent stages of the Floquet mode TWPA. The phase adjustment circuitry 30 may comprises LC resonators, wherein the pump frequency is tuned at or near the frequency of the LC resonators.

The phase adjustment circuitry 30 is used to disturb the dispersion or wave velocity near the pump frequency and therefore allow the phase matching or momentum conservation to be better satisfied for the amplification process (i.e., between pump and the resulting signal and idlers). The phase adjustment circuitry helps increase the achievable signal gain as compared to circuits which do not incorporate the phase adjustment circuitry. In other embodiment, such as when the nonlinear elements 10 comprises SNAIL or flux qubits, the phase adjustment circuitry 30 may not be used.

Each nonlinear element 10 has a property referred to as the physical critical current. This represents the maximum current that may be passed while the nonlinear element 10 remains in the superconducting state. For Josephson junctions, the critical current is determined based on the area of overlay between the two superconducting links (also referred to as junction area) and the thickness of the dielectric between these links. Thus, assuming a constant dielectric thickness, a larger junction area will result in a larger critical current. Furthermore, as described above, a Josephson junction behaves like a nonlinear inductor. The inductance of the Josephson junction varies inversely with critical current. In other words, the larger the critical current, the smaller the inductance. Importantly, it has been found that varying critical current of the nonlinear elements 10 along the stages of the Floquet mode TWPA significantly improves performance. Without being bound to a particular theory, it is believed that the adiabatic spatial variation reduces the coupling of the signal interest to higher order sideband frequency modes. These sideband frequency modes are unwanted byproducts and are caused by the other parasitic nonlinear processes that happen concurrently with the amplification process in the system. These sideband frequency modes will take some amount of signal away and also inject noise into the remaining signal, so the variation of critical current through the circuit 1 overall improves the noise performance, and stability.

Specifically, in certain embodiments, the critical current is set to a large value at the first stage and the last stage of the Floquet mode TWPA of the circuit 1. This larger critical current also implies a smaller inductance and a smaller gain in that nonlinear element 10.

This larger critical current reduces the gain and interfaces much better to traditional linear input and output transmission lines, such as 50 Ω transmission lines. The larger critical current at the ends reduces the nonlinearity and the rate of amplification (gain coefficient) of the system, and therefore better mode matches the nonlinear propagation modes in the Floquet TWPA to the linear frequency modes in the input and output transmission lines. This may reduce coupling of signal to other undesirable sideband modes and vice versa, reducing the input sideband frequency noises to the signal mode propagating in the Floquet TWPA.

Furthermore, the adiabatic variation of the critical current of the nonlinear elements 10 along the stages of the Floquet mode TWPA also suppresses the extraneous higher harmonic frequency products of the pump at the input and output.

In some embodiments, the critical current then decreases adiabatically moving toward the center of the traveling wave parametric amplifier, reaching its minimum value at the center stage of the TWPA. The values of the critical current of a nonlinear element 10 when plotted against the stage number may appear as an inverse Gaussian distribution, as shown in FIG. 3A.

In other embodiment, shown in FIG. 3B, a trough 300 is created near or around the center stage. The trough may have an electrical length of 80 wavelengths, although other electrical lengths may be used. The trough 300 is characterized as a continuous series of stages where the critical current of each nonlinear element 10 in those stages varies by less than 5% from the minimal critical current in the circuit. In some embodiments, at least 10% of the stages are in the trough 300. In some embodiments, at least 15% of the stages are in the trough 300. In another embodiments, at least 25% of the stages are in the trough 300.

Furthermore, in certain embodiments, an expanded trough 310 is defined, wherein the expanded trough 310 is defined as a continuous series of stages that have a critical current that is within 10% of the minimum critical current. In some embodiments, at least 30% of the stages are in the expanded trough 310. In some embodiments, at least 40% of the stages are in the expanded trough 310. In certain embodiments, at least 50% of the stages are in the expanded trough 310. In certain embodiments, at least 60% of the stages are in the expanded trough 310.

Additionally, a second expanded trough 320 may be defined as a continuous series of stages that have a critical current that is within 20% of the minimum critical current. In some embodiments, at least 50% of the stages are in the second expanded trough 320. In some embodiments, at least 65% of the stages are in the second expanded trough 320.

In certain embodiments that utilize a trough 300, the ratio of the maximum critical current of any stage as compared to the minimum critical current is at least 2.

In FIG. 3B, the values of the critical current when plotted against the stage number, with the exception of the stages that are part of the trough 300, may still appear as an inverse Gaussian distribution. Note, however, that other curves may be used with the trough. For example, a monotonically decreasing curve may exist from the input to the trough and a monotonically increasing curve may exist from the trough to the output.

Smaller minimum critical currents lead to larger junction inductance, which in turn results in larger wave velocity dispersion and narrower amplification bandwidth at the same center frequency of interest. Compared to Floquet mode TWPA designs using a Gaussian function with smaller minimum critical currents, Floquet mode TWPAs with a trough have a larger bandwidth at the same center frequency of interest, by having a larger minimum critical current while achieving a similar gain level. Therefore, in certain embodiments, the ratio of the maximum critical current is limited to less than 5. Furthermore, the disclosed configuration allows the Floquet mode TWPA to be amplified efficiently in fewer stages than Floquet TWPAs using a Gaussian function with the same minimum critical current. Floquet mode TWPAs having this configuration can therefore be implemented using low-loss distributed capacitors in a smaller footprint, thereby mitigating the electromagnetic mode issues from larger chip packaging.

However, other embodiments are possible. For example, the critical current values may decrease linearly until the center stage and then increase linearly (at the same slope) to the output. Generally, the values of critical current may decrease monotonically from the input to the center and then increase monotonically from the center to the output. In some embodiments, the values of critical current are symmetric about the center stage of the TWPA. In other words, if there are an odd number of stages and the center stage is referred to as C, the critical current at stage C-n is the same as the critical current at stage C+n, for n less than C. Similarly, if there is an even number of stages, the center two stages may both be referred to as C, and again, the critical current at stage C-n is the same as the critical current at stage C+n, for n less than C.

In other embodiments, the values of the critical current may not be symmetric about the center stage. Further, in certain embodiments, the smaller critical current may not occur at the center stage. FIG. 3C shows such a configuration, where the smallest critical current is not at the center and the graph is not symmetrical about the center stage.

As described above, the critical current of each nonlinear element 10 may be adjusted by changing the junction area or the thickness of the dielectric. For a constant dielectric material and thickness, smaller junction areas have smaller critical currents and therefore higher gain. Thus, in FIG. 1A, if it is assumed that the dielectric thickness is constant, the junction area of the nonlinear elements 10 decreases from the input to the center stage and then increases again to the output.

In summary, the nonlinearities of the nonlinear elements 10 are made smallest at both ends of the device and adiabatically increase towards the middle by adjusting the junction area and therefore the junction critical current.

In certain embodiments, the ratio of the largest critical current in the circuit 1 to the smallest critical current may be at least 2. In some embodiments, this ratio may be at least 2.5.

In some embodiments, this ratio may be between 2 and 5. In other embodiments, this ratio may be between 2 and 4.

Larger ratios allow larger critical current at the input and output of the device. This is advantageous in mode matching to the linear input and output transmission lines. However, it may be challenging to physically realize the large range of critical current and junction areas in practice. For example, the largest critical current value is limited by the largest junction area of Dolan-style Josephson junctions can attain before collapsing. For Manhattan-style or Lecocq-style junctions, a large critical current range causes either long costly lithography write times for larger Josephson junctions or worse critical current variations and nonuniformity for the smaller Josephson junctions. This causes random impedance mismatches, worse reflection, and increased unwanted backward amplification. Thus, by limiting the maximum ratio and utilizing the intrinsic linear parasitic inductance of the large critical current junctions near the input and output stages, the disclosed circuit achieves good mode matching to the linear input and output transmission lines, while allowing the desired critical current profile to be realistically fabricated with higher uniformity and shorter lithography write time, as compared to TWPAs that use a higher ratio.

In some embodiments, the stage with the largest critical current may not be the first or last stage. Similarly, in some embodiments, the stage with the smallest critical current may not be the center stage. However, in these embodiments, the ratio of the largest critical current found in any nonlinear element in the TWPA to the smallest critical current found in any nonlinear element in the TWPA may be at least 2. In other embodiments, this ratio may be at least 2.5. In certain embodiments, this ratio is less than 5.

Further, in certain embodiments, due to process variations or other considerations, the plot of the critical current of each nonlinear element 10 as a function of stage may not be as shown in FIG. 3A. For example, the critical current of a nonlinear element may be greater than that of each of the adjacent nonlinear elements.

The concept of a segment is introduced. A segment is defined as a chain of nonlinear elements 10 whose electrical length is equal to the wavelength of interest. A segment comprises 5 or more stages. The input segment is defined as the segment that includes the first stage of the TWPA near the input 40. The output segment is defined as the segment that includes the last stage of the TWPA near the output 50. Finally, the high gain segment is defined as a segment that includes the stage having the nonlinear element with the smallest critical current. In certain embodiments, the high gain segment may include the center stage. In other embodiments, the high gain segment may be the trough described in FIG. 3B. In certain embodiments, the average critical current for all nonlinear elements in the input segment is at least twice the average critical current of all of the nonlinear elements in the high gain segment. In some embodiments, the average critical current for all nonlinear elements in the input segment is also no more than 5 times the average critical current of all of the nonlinear elements in the high gain segment.

As noted above, the critical current may be decreased by reducing the junction area of the Josephson junction 13. However, this reduction in the size of the Josephson junction 13 also increases its inductance. Further, it is advantageous to maintain the impedance of each stage at a constant value or alternatively vary adiabatically. In some embodiments, the impedance of each stage is maintained within 20% of the adjacent stages. This minimizes reflections and maximizes transmission through the TWPA. Further, this minimizes the unwanted backward amplification due to forward waves being amplified and then reflected back, leading to worse directionality. Thus, because the inductance of the Josephson junction 13 varies, the value of the shunt capacitor 20 may also vary.

FIG. 4A shows a first embodiment of a shunt capacitor. In this embodiment, the shunt capacitors are formed as distributed planar stub capacitors. In this embodiment, the stub 21 extends from the trace 23. The stub 21 is surrounded by the ground plane 22. A capacitive coupling is created between the stub 21 and the ground plane 22, which results in a shunt capacitor. The longer the length of the stub 21, the greater the value of the capacitance. While FIG. 4A shows a coplanar wave stub capacitor, it is understood that planar capacitors include waveguide stub capacitors or interdigitated capacitors.

Figure 1B:
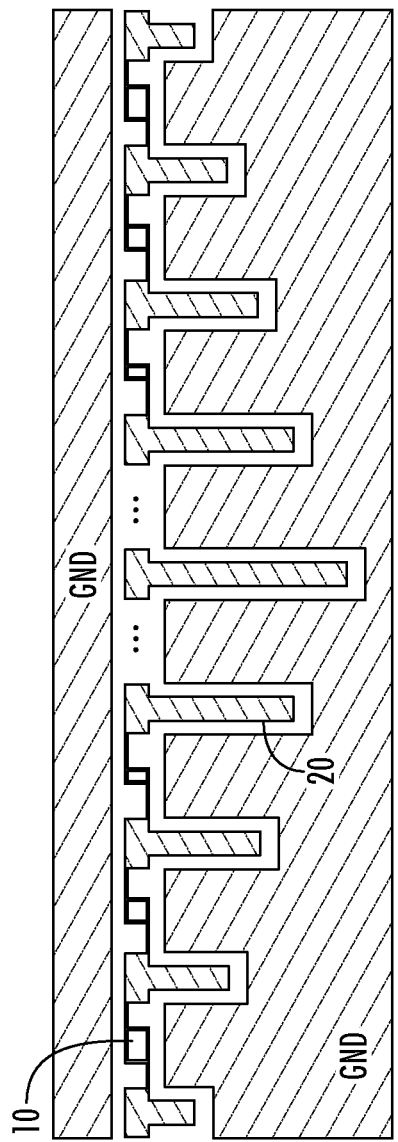
FIG. 1B shows the physical layout of the Floquet mode traveling wave parametric amplifier of FIG. 1A according to a first embodiment.

This configuration of shunt capacitor is used in FIG. 1B. Note that the lengths of the stubs 21 grow approaching the center stage of the circuit 1. Further, note that the stubs 21 decrease in length after the center stage. Like the inductance of the Josephson junctions, the values of the shunt capacitors 20 may also be symmetrical about the center stage. Further, the value of the shunt capacitors may be equal in the trough 300, as shown in FIG. 3B.

Figure 1C:
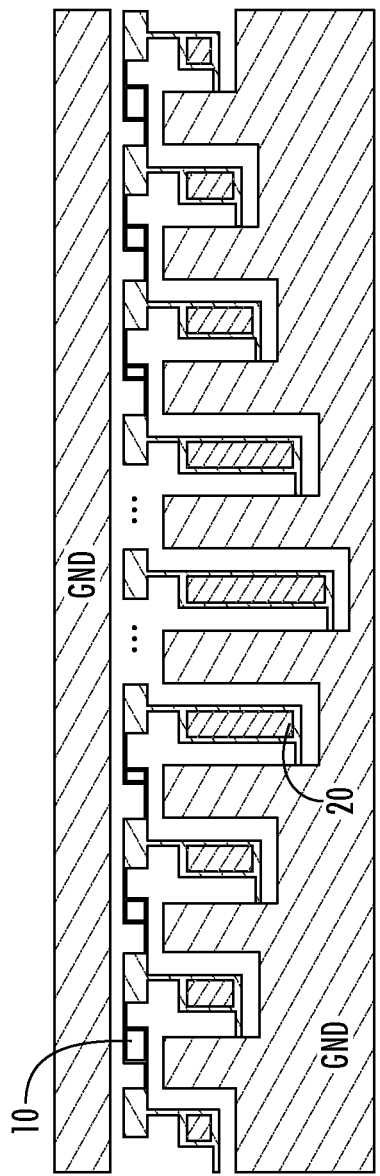
FIG. 1C shows the physical layout of the Floquet mode traveling wave parametric amplifier of FIG. 1A according to a second embodiment.

FIG. 4B shows a second embodiment that may be used to create the shunt capacitors 20. In this embodiment, the capacitors are formed as low loss parallel plate capacitors. In one embodiment, these are formed with a controlled in-situ oxidization dielectric material of the top surface of bottom metal plate 26 disposed between two plates 25, 26 on separate layers of the substrate. Alternatively, the dielectric material may be disposed through the use of atomic layer deposition (ALD). In this embodiment, one of the plates is electrically connected to the ground plane as shown in FIG. 1C. The larger the overlapped region between the two plates 25, 26, the greater the capacitance.

These low-loss capacitors, in the form of planar capacitors or parallel plate capacitors, have a loss tangent tan $\delta < 10^{-4}$ using high quality superconducting circuit fabrication processes. The distributed planar capacitors, shown in FIG. 4A, combined with the use of crystalline high resistivity wafer substrates, such as those with resistivity of greater than 1000 $\Omega$cm or greater than 10 k$\Omega$cm, lead to a small electric field participation ratio at material interfaces, which are rich in structural defects known as two-level-systems (TLS) that dominates the material loss of current superconducting circuit elements.

Also, parallel plate capacitors with the inner dielectric formed by controlled oxidation of evaporated metals in a high-vacuum chamber or ALD, shown in FIG. 4B, similarly have reduced densities of TLS compared to parallel plate capacitors formed with chemical vapor deposited $SiO_x$ commonly used in current conventional TWPAs.

Consequently, the disclosed implementation using planar capacitors or controlled-oxidized parallel plate capacitors may significantly reduce the material loss caused by the extended electrical lengths of traveling-wave structures and realize low-loss Floquet mode TWPAs with near-ideal quantum efficiency.

The use of planar capacitors is complicated due to the fabrication process associated with Josephson junctions.

Specifically, the directionality of the evaporation angle requirement for a single deposition requires all Josephson junctions to align in the same direction. Further, due to the large number of stages and large footprint of the planar capacitors, the circuit may not be able to be fabricated in a linear manner (such as is shown in FIG. 1A). Thus, a serpentine pattern may be used. However, since all the Josephson junctions must align in the same direction, the physical layout of the stages is different. For example, for some stages, the direction of the planar capacitors may be perpendicular to the direction of the Josephson junctions. However, for other stages, this is not possible, due to layout concerns. This difference may result in different parasitics and potential impedance mismatch, complicating the design of the TWPA. In addition, without the use of the trough 300 in the critical current profile, the large physical size of planar capacitors and the longer electrical and physical length of the Floquet TWPAs may lead to a device footprint large enough to cause electromagnetic mode issues from larger chip packaging. Because of these issues, the use of planar capacitors with Josephson junctions in implementing low-loss Floquet mode TWPA is not obvious.

An example of the Floquet mode TWPA described herein was fabricated with low-loss distributed coplanar capacitors on a high-resistivity silicon substrate (such as greater than 10 KΩcm) on a 5×40 mm chip designed for 4-12 GHz. In one particular embodiment, each nonlinear element includes three Josephson junctions in series, and the smallest critical current is 5 uA, although other values may be used. The largest capacitance value is roughly 90 fF, and appears in the trough 300. In this particular embodiment, the circuit 1 includes 2870 total stages, although it is understood that the circuit 1 may contain fewer stages, if desired. The ratio of a maximum critical current to the minimum critical current is roughly 2.5, although ranges from 2 to 5 may be used in other embodiments. The electrical length of the circuit 1 is 366 wavelengths, although electrical lengths between 150 and 400 wavelengths may also be used.

Figure 5A:
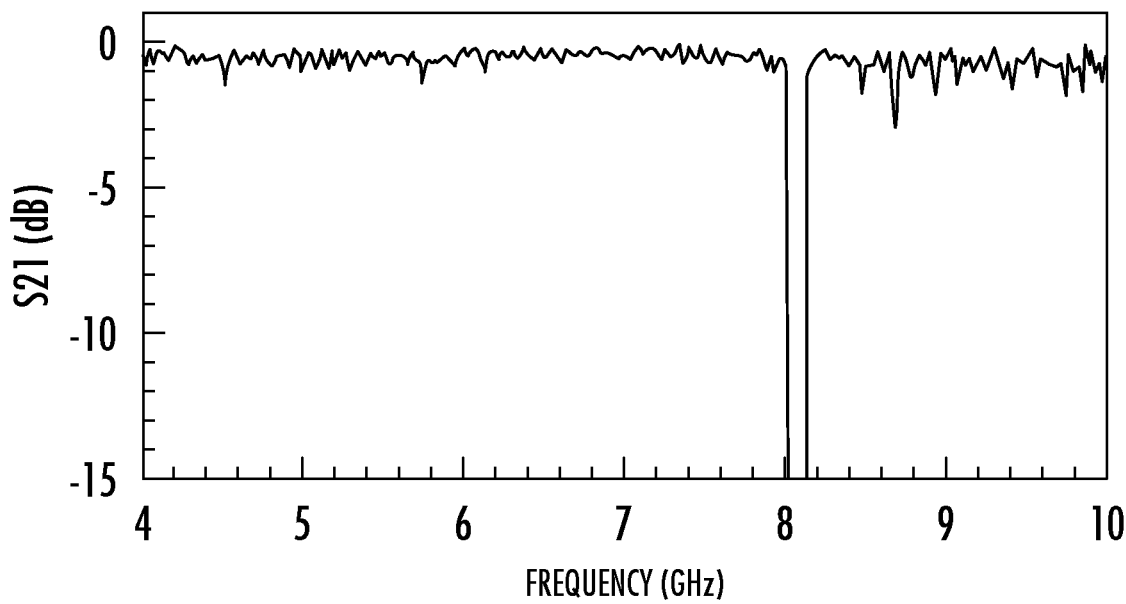
FIG. 5A shows the measured single-photon-level insertion loss as a function of frequency.
Figure 5B:
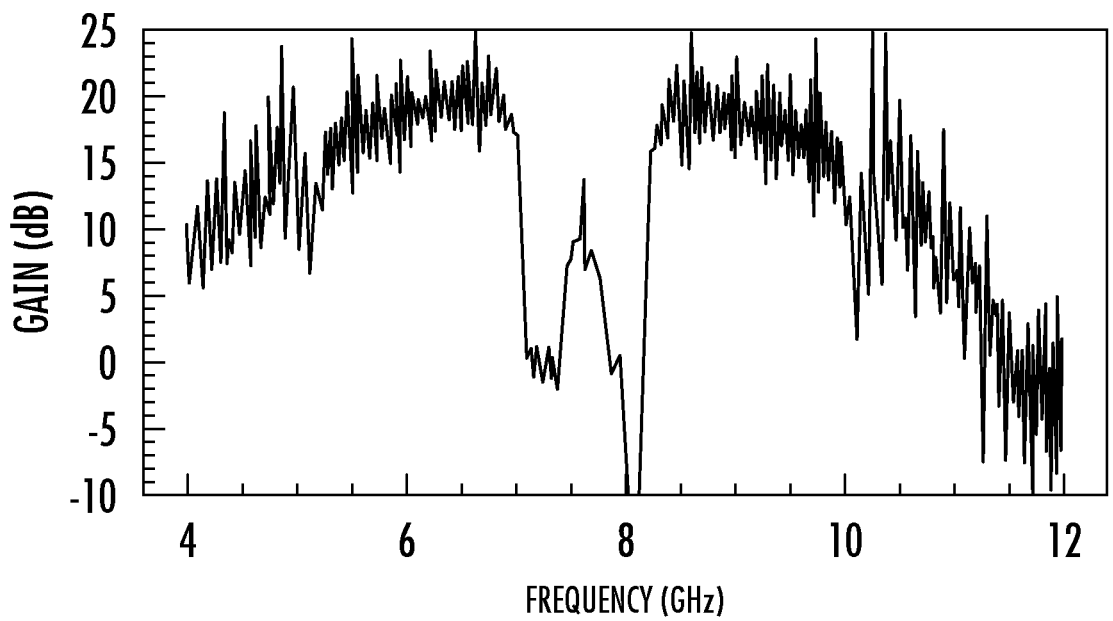
FIG. 5B shows measured gain as a function of frequency.

The insertion loss at input power of approximately −120 dBm, which is shown in FIG. 5A, was measured to be less than 1 dB over the operating bandwidth of interest (outside of the phase-matching resonator bandgap at ~8 GHz), significantly smaller than the current conventional TWPAs (~3 dB at 6 GHz) using chemical vapor deposited $SiO_x$ parallel plate capacitors. A 3 dB bandwidth of more than 3 GHz (excluding the middle phase-matching resonator bandgap) with a peak gain over 20 dB was also measured and is shown in FIG. 5B. The intrinsic amplifier quantum efficiency is expected to be higher than 98% over the entire amplification bandwidth due to the small insertion loss and high gain (~20 dB).

The embodiments described above in the present application may have many advantages. The disclosed Floquet mode TWPA may potentially read out tens of superconducting qubits in a single unit, just as with conventional TWPAs, but with near-ideal quantum efficiency (~100%) on par with those of JPAs. Furthermore, the disclosed Floquet mode TWPA also have improved directionality, suppression of unwanted higher pump harmonic frequency products at input and output, and insensitivity to out-of-band impedance mismatch over conventional TWPAs.

By using superconducting-qubit-compatible processes such as an aluminum process, the disclosed low-loss Floquet mode TWPA superconducting circuit implementation can be potentially on-chip integrated with current qubits without the use of nonreciprocal elements, such as circulators or isolators, which are required to protect the qubits from the back reflection of the current high-performance amplifiers. The direct integration can potentially lead to significant further improvements in system measurement efficiency. Combined with the advantages of improved directionality and insensitivity to out-of-band impedance mismatch, the disclosed TWPA will lead to significant reduction in the footprint and resources of the measurement hardware for large-scale quantum machines by reading out tens to hundreds of superconducting qubits with high fidelity simultaneously on a single measurement line.

To solve classically intractable problems in cryptography, pharmaceutical design, energy and food production, manufacturing optimization, and artificial intelligence, quantum machines require thousands or millions of qubits to be precisely measured and controlled at the same time during operations. The current measurement hardware is challenging to scale to such a level due to the significant resource and space overhead. The disclosed TWPA allows for tens or hundreds of superconducting qubits to be measured at once using a single device with high fidelity. It has the potential of significantly improving the measurement speed, fidelity, and the scalability of quantum machines for both academic research and industrial use.

Further, the noise performance of the disclosed TWPA is approximately ten times better than those of the commercially available semiconductor high electron mobility transistors (HEMT) amplifiers. Compared to the conventional TWPAs, the disclosed low-loss superconducting circuit Floquet TWPA has approximately 20% better quantum efficiency and has the additional advantages of improved directionality, stability, and smoothness in gain response, all of which are of great importance to superconducting quantum experiments and metrology.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A Floquet mode traveling wave parametric amplifier (TWPA), having an input and an output, comprising:
a circuit having a plurality of stages, wherein each stage comprises a nonlinear element and a capacitor, wherein a critical current of the nonlinear element decreases monotonically from the input to a trough and increases from the trough to the output, wherein the trough is defined as a continuous series of stages wherein each stage in the trough has a critical current within 5% of a minimum critical current, and wherein at least 10% of the stages are in the trough.

2. The Floquet mode TWPA of claim 1, wherein an expanded trough is defined as a continuous series of stages wherein each stage in the expanded trough has a critical current within 10% of the minimum critical current, wherein at least 30% of the stages are in the expanded trough.

3. The Floquet mode TWPA of claim 2, wherein at least 40% of the stages are in the expanded trough.

4. The Floquet mode TWPA of claim 1, wherein a ratio of a maximum critical current to the minimum critical current is at least 2.

5. The Floquet mode TWPA of claim 1, wherein the nonlinear element comprises a Josephson junction or a plurality of Josephson junctions arranged in series, in parallel or a combination of serial and parallel.

6. The Floquet mode TWPA of claim 1, wherein the circuit is disposed on a substrate having a resistivity greater than 1000 Ωcm and the capacitor comprises a planar capacitor.

7. The Floquet mode TWPA of claim 1, wherein the capacitor comprises a parallel plate capacitor wherein a dielectric material between parallel plates is formed using controlled in-situ oxidation.

8. The Floquet mode TWPA of claim 1, wherein each capacitor is configured such that an impedance of a stage is within 20% of an adjacent stage.

9. The Floquet mode TWPA of claim 1, wherein a graph of critical current as a function of stage number, excluding the trough, is an inverse Gaussian curve.

10. The Floquet mode TWPA of claim 1, wherein the nonlinear elements are chained together and the capacitors comprise shunt capacitors.

11. A Floquet mode traveling wave parametric amplifier (TWPA), having an input and an output, comprising:
a circuit having a plurality of stages, wherein each stage comprises a nonlinear element and a capacitor, wherein a ratio of a largest critical current of one of the nonlinear elements to a smallest critical current of another of the nonlinear elements is between 2 and 5.

12. The Floquet mode TWPA of claim 11, wherein the nonlinear element comprises a Josephson junction or a plurality of Josephson junctions arranged in series, in parallel or a combination of serial and parallel.

13. The Floquet mode TWPA of claim 11, wherein the one of the nonlinear elements with the largest critical current is the nonlinear element disposed in the stage adjacent to the input or the output.

14. The Floquet mode TWPA of claim 11, wherein the circuit is disposed on a substrate having a resistivity greater than 1000 Ωcm and the capacitor comprises a planar capacitor.

15. The Floquet mode TWPA of claim 11, wherein the capacitor comprises a parallel plate capacitor wherein a dielectric material between parallel plates is formed using controlled in-situ oxidation.

16. The Floquet mode TWPA of claim 11, wherein the nonlinear elements are chained together and the capacitors comprise shunt capacitors.

17. A Floquet mode traveling wave parametric amplifier (TWPA), having an input and an output, comprising:
a circuit having a plurality of stages, including an input stage at the input, an output stage at the output;
wherein each stage comprises a nonlinear element and a capacitor and each nonlinear element has a critical current;
wherein a segment is defined as a chain of stages having an electrical length equal to one wavelength of interest,
wherein the segment comprising the stage adjacent to the input is defined as an input segment;
wherein the segment comprising a stage having a smallest critical current is defined as a high gain segment; and
wherein a ratio of an average of critical currents in the input segment to the average of critical currents in the high gain segment is between 2 and 4.

18. The Floquet mode TWPA of claim 17, wherein the segment comprising the stage adjacent to the output is defined as an output segment;
wherein the ratio of the average of critical currents in the output segment to the average of critical current in the high gain segment is between 2 and 4.

19. The Floquet mode TWPA of claim 17, wherein the wavelength of interest is between 30 μm and 3 meters.

20. The Floquet mode TWPA of claim 17, wherein each segment comprises at least five stages.

21. The Floquet mode TWPA of claim 17, wherein the circuit has an electrical length of at least five wavelengths.

22. The Floquet mode TWPA of claim 17, wherein the nonlinear elements are chained together and the capacitors comprise shunt capacitors.

23. The Floquet mode TWPA of claim 1, wherein the capacitor comprises a parallel plate capacitor wherein a dielectric material between parallel plates is formed using atomic layer deposition.

24. The Floquet mode TWPA of claim 11, wherein the capacitor comprises a parallel plate capacitor wherein a dielectric material between parallel plates is formed using atomic layer deposition.

* * * * *